(12) United States Patent
Kett et al.

(10) Patent No.: US 9,660,434 B2
(45) Date of Patent: May 23, 2017

(54) ELECTRICAL POWER DISTRIBUTOR FOR AN ELECTRIC OR HYBRID VEHICLE

(71) Applicant: LEONI BORDNETZ-SYSTEME GMBH, Kitzingen (DE)

(72) Inventors: Alexander Kett, Luhe-Wildenau (DE); Volker Albert, Dettelbach (DE); Wolfgang Hauschild, Zirndorf (DE); Christian Dehn, Altdorf (DE)

(73) Assignee: Leoni Bordnetz-Systeme GmbH, Kitzingen (DE)

( * ) Notice: Subject to any disclaimer, the term of this patent is extended or adjusted under 35 U.S.C. 154(b) by 0 days.

(21) Appl. No.: 15/000,208

(22) Filed: Jan. 19, 2016

(65) Prior Publication Data

US 2016/0134096 A1     May 12, 2016

Related U.S. Application Data

(63) Continuation of application No. PCT/EP2014/065172, filed on Jul. 15, 2014.

(30) Foreign Application Priority Data

Jul. 17, 2013    (DE) ........................ 10 2013 011 874

(51) Int. Cl.
*H05K 9/00*      (2006.01)
*H01R 4/20*      (2006.01)
(Continued)

(52) U.S. Cl.
CPC ............. *H02G 15/103* (2013.01); *H01R 4/20* (2013.01); *H01R 31/02* (2013.01);
(Continued)

(58) Field of Classification Search
CPC ......... H01R 31/02; H01R 4/20; H05K 9/0098
See application file for complete search history.

(56) References Cited

U.S. PATENT DOCUMENTS 4,533,197 A * 8/1985 Prince ................... H01R 9/032
                                         439/404
4,701,137 A * 10/1987 DeRoss ................. H01R 9/053
                                         439/394
(Continued)

FOREIGN PATENT DOCUMENTS

DE         2050305 A1    4/1971
DE         3822573 A1    1/1990
(Continued)

OTHER PUBLICATIONS

Engbring, J., "Der Weg zum optimalen HV-Bordnetz", E-Mobility, Feb. 2012, pp. 40-43, URL: http://www.leoni-electromobility.com/fileadmin/bu/emo/fachartikel/120999_E-Mobility_Der-Weg-zum-optimalen-Bordnetz_final.pdf.
(Continued)

*Primary Examiner* — Hung V Ngo
(74) *Attorney, Agent, or Firm* — Laurence A. Greenberg; Werner H. Stemer; Ralph E. Locher

(57) ABSTRACT

A high-voltage power distributor is configured to keep the need for high-voltage supply lines as low as possible for an electric or hybrid vehicle having an electric-motor driving motor. The high-voltage power distributor has a distributor housing formed with a connection space. At least one incoming supply line and two outgoing supply lines, which are connected to each other, are introduced into the connection space. The distributor housing has a two-part construction, with an electrically conductive inner housing and an insulating outer housing. Each respective shield of a respective supply line is connected to the inner housing in an electrically conductive manner. Thus, a mechanically robust design is enabled together with good EMC shielding in the connection region of the supply lines, and furthermore reliable sealing with respect to the environment is enabled.

17 Claims, 4 Drawing Sheets

(51) Int. Cl.
  *H02G 15/103* (2006.01)
  *H02G 3/06* (2006.01)
  *H02G 3/08* (2006.01)
  *H02G 15/013* (2006.01)
  *H02G 15/113* (2006.01)
  *H01R 31/02* (2006.01)
  *H02G 15/007* (2006.01)
  *H02G 15/117* (2006.01)
  *H02G 15/16* (2006.01)

(52) U.S. Cl.
  CPC .......... *H02G 3/0666* (2013.01); *H02G 3/083* (2013.01); *H02G 15/013* (2013.01); *H02G 15/113* (2013.01); *H05K 9/0098* (2013.01); *H02G 15/007* (2013.01); *H02G 15/117* (2013.01); *H02G 15/16* (2013.01)

(56) References Cited

U.S. PATENT DOCUMENTS

| | | | | |
|---|---|---|---|---|
| 4,879,807 A * | 11/1989 | Roucaute | ................ | H01R 4/72 174/88 C |
| 5,044,978 A * | 9/1991 | Gelin | ................... | H01R 9/0509 439/394 |
| 5,306,870 A | 4/1994 | Abat | | |
| 6,280,208 B1 | 8/2001 | Masuda et al. | | |
| 6,443,756 B1 * | 9/2002 | Hagmann | ............... | H01R 31/02 439/402 |
| 6,688,896 B2 | 2/2004 | Matsumoto | | |
| 7,658,647 B2 | 2/2010 | Reker | | |
| 8,003,888 B2 * | 8/2011 | Owen, Sr. | ................ | H02G 1/14 174/135 |
| 8,282,401 B2 | 10/2012 | Hensen et al. | | |
| 2015/0114711 A1 * | 4/2015 | Dew | ................. | H02G 15/1806 174/72 A |

FOREIGN PATENT DOCUMENTS

| | | |
|---|---|---|
| DE | 9017029 U1 | 3/1991 |
| DE | 29608312 U1 | 8/1996 |
| DE | 19733853 A1 | 2/1999 |
| DE | 10016943 A1 | 10/2000 |
| DE | 69805088 T2 | 10/2002 |
| DE | 10222820 A1 | 12/2002 |
| DE | 20311379 U1 | 10/2003 |
| DE | 202007014490 U1 | 3/2009 |
| DE | 102008059477 B4 | 9/2010 |
| EP | 2463959 A1 | 6/2012 |
| GB | 2104306 A | 3/1983 |

OTHER PUBLICATIONS

Hopf, M., "Hochvolt Leistungsverteiler fuer Hybrid- und Elektrofahrzeuge", Eletronikpraxis Elektromechanik, Nov. 2012, pp. 108-110, URL: http://www.leoni-electromobility.com/fileadmin/bu/emo/news/121199__Elektronikpraxis_HV-Verteilerbox.pdf.

* cited by examiner

ELECTRICAL POWER DISTRIBUTOR FOR AN ELECTRIC OR HYBRID VEHICLE

CROSS-REFERENCE TO RELATED APPLICATION

This application is a continuation, under 35 U.S.C. §120, of copending international application No. PCT/EP2014/065172, filed Jul. 15, 2014, which designated the United States; this application also claims the priority, under 35 U.S.C. §119, of German patent application No. DE 10 2013 011 874.3, filed Jul. 17, 2013; the prior applications are herewith incorporated by reference in their entirety.

BACKGROUND OF THE INVENTION

Field of the Invention:

The invention concerns an electric power distributor for an electric or hybrid vehicle as well as a distributor housing for such a power distributor.

In electric or hybrid vehicles with electric motor drive system, several components, including the drive motor, are supplied with high voltages. The term "high voltage," in this context, means voltage values of a few hundred volts, typically in the range of 300 V to 600 V, for example.

In such a motor vehicle, therefore, several different voltage consumers need to be connected by corresponding high voltage supply lines to the onboard current and voltage supply, usually a storage battery, or also a generator. If the components being connected are far removed from the current or voltage source, long paths are required for the supply lines. On account of the high voltages and the correspondingly high powers which are carried by them, these are relatively cost intensive, heavy, and also require considerable installation space.

SUMMARY OF THE INVENTION

It is accordingly an object of the invention to provide an electrical power distributor for an electric vehicle or a hybrid vehicle and a distributor housing for such a power distributor which overcomes the above-mentioned and other disadvantages of the heretofore-known devices and methods of this general type and which keeps as low as possible the wiring expense for such high voltage supply lines in an electric or hybrid vehicle.

With the foregoing and other objects in view there is provided, in accordance with the invention, an electric power distributor for an electric or hybrid vehicle with an electric motor drive system, the power distributor comprising:

a distributor housing having an inner housing made from two shells of an electrically conductive material enclosing a connection space and an outer housing of an electrically insulating material encasing said inner housing in a shell form;

a plurality of supply lines including at least one incoming supply line and at least two outgoing supply lines connected in said connection space to said incoming supply line, said supply lines entering said connection space through a housing feed-through socket;

said supply lines having a shielding connected electrically conductively with said inner housing;

a shielding sleeve subassembly electrically connected to said inner housing and making electrical contact with said shielding, said shielding sleeve subassembly having an underlying sleeve and a clamping element fashioned as a sleeve, and wherein said shielding is clamped between said underlying sleeve and said clamping element;

said inner housing having in each case a connecting piece to form the respective said housing feed-through socket in which said shielding sleeve subassembly is clamped, and wherein said shielding sleeve subassembly is fixed in an axial direction in the respective said housing feed-through socket, with at least one of said underlying sleeve and said clamping element being radially widened at both ends to form a form fit with said inner housing acting in both axial directions.

In other words, the above and other objects are solved, in accordance with the invention, by an electric high voltage power distributor, which is configured for installation preferably in an electric or hybrid vehicle with an electric motor drive system. In this case, the power distributor has a distributor housing with a connection space, in which at least one incoming supply line is connected to at least two outgoing supply lines. The supply lines are each introduced into the connection space through a housing feed-through socket.

In the simplest case, the power distributor is therefore configured in the manner of a Y or even a T distributor, for example, which connects an incoming supply line to two outgoing supply lines. Alternative configurations with more incoming and outgoing supply lines are likewise possible. Essentially, only one potential or one conductor, such as the positive reference potential of the storage battery, needs to be introduced into the power distributor and distributed among the outgoing supply lines. Especially in motor vehicles, a connection to the negative reference potential is often accomplished by a different ground connection. Alternatively, however, the possibility exists of distributing two incoming insulated high voltage conductors for, say, the positive and the negative reference potential respectively among the outgoing supply lines in the power distributor.

Therefore, thanks to this power distributor, especially one formed in the manner of a Y distributor, the possibility exists of distributing a high voltage power in a decentralized manner and thus supplying different components. For this, for example, only one high voltage supply line needs to be guided from the rear of the vehicle to the front region before the supply line is divided there by the power distributor into two additional supply lines in order to hook up various components. Thus, there is no need for a double routing throughout the entire motor vehicle.

Basically, the possibility also exists of designing the power distributor to divide into more than two supply lines. The basic principle remains the same.

Due to the high voltages, the high voltage supply lines are provided with a shielding, in order to avoid interference in the onboard electronics network. To ensure a simple design and at the same time a robust shielding even in the connection region of the incoming and outgoing supply lines, as claimed in the invention furthermore the distributor housing is two-part and comprises a shell-type inner housing which is self-supporting and surrounds the connection space, being made from two shells of an electrically conductive material that are joined together, so that the connection site between the incoming supply line and the outgoing supply line is EMC shielded. Furthermore, the distributor housing has an outer housing of an electrically insulating material. This is sealed off in particular from the environment, so that no moisture can penetrate into the connection space, where the conductor ends of the individual supply lines are exposed to their mutual connection. The outer housing furthermore contains the inner housing like a shell. The inner housing therefore lies preferably with its outer walls directly against the inner walls of the outer housing. The contours and bulges of the two housings are adapted to each other. The outer housing therefore preferably fits snugly on the inner housing and encloses it entirely. This achieves a reliable sealing against the environment. The two housings therefore lie like shells one in the other. Thanks to the sealing via the outer housing, the connection space also does not need to be encased for sealing purposes. Therefore, the connection space is a free, air-filled interior space.

Any shielding of the supply lines is furthermore each time connected electrically conductively to the inner housing. Therefore, the shieldings are continuously connected together across the inner housing without interruption. By the electrically conductive inner housing the connection region of the supply lines is reliably electrically shielded. Thanks to the two-part design of the distributor housing, the special advantage is achieved already that the two functions of the electrical shielding and the sealing off from the environment are decoupled from each other, so that the two housings can each be designed especially in regard to their particular function. By inner housing here is meant any encasement and bounding off of the connection space which accomplishes a complete electromagnetic shielding of the connection space.

In regard to the most robust and simplest configuration possible, the inner housing is a massive housing, especially a sheet metal housing, provided with continuous walls. The inner housing is thus self-supporting and therefore ensures the mechanical stability of the distributor housing as a whole, or at least contributes significantly to this. Preferably, the inner housing is a bent sheet metal part, a stamped and bent sheet metal part, or a deep-drawn part, so that a simple and economical fabrication is also assured. Alternatively to the massive design, in order to reduce its weight the inner housing is also provided with openings or designed overall in the manner of a lattice, yet naturally rigid and self-supporting.

Except for the housing feed-through sockets to the connection space, the inner housing is advisedly closed entirely. This achieves a good EMC shielding.

In accordance with a first variant implementation of the invention, the outer housing is formed by an overmolding process. By overmolding is meant any embedding of the inner housing in an at first at least viscous deformable compound which is then hardened. Therefore, "overmolding" includes in particular a recasting. The inner housing is therefore embedded in an injection molded or cast part, which defines the outer housing. The inner housing therefore forms as it were the negative mold for the outer housing.

In accordance with an alternative feature of the invention, the outer housing is fashioned as a separate and independent part of separately fabricated and interconnected shell pieces, which are placed around the inner housing.

In regard to a simple design assembly, the outer housing and/or the inner housing preferably each consist of two half shells, which thus form a vaulted structure and enclose the connection space between them. The half shells are preferably identical parts, so that the lower and upper shell of the inner housing in particular are identical.

Also in the case of the overmolded variant, the inner housing consists of two half shells. Advisedly, the half shells are formed with an encircling edge, wherein the edge of the inner housing lies preferably between the half shells of the outer housing and especially between the respective edges of the outer housing or are enclosed by the casting material in the overmolded variant. This accomplishes a simple assembly as well as a reliable fixation of the inner housing. The outer housing is preferably an inherently rigid plastic housing, which is likewise self-supporting.

In order to assure a tight introduction of the individual supply lines into the connection space, they are preferably sealed and led through the respective housing feed-through sockets. Advisedly for this, a sealing element is placed in the housing feed-through socket, especially between the half shells of the distributor housing.

Alternatively to a direct sealing, in preferred embodiment an indirect sealing is configured, in which a sealing sleeve with sealing element inserted therein is provided. The supply line here is led through and sealed by the sealing element. The sealing sleeve furthermore ensures the sealing against the inner wall of the housing feed-through socket. In this way, a decoupled sealing is therefore accomplished on the one hand from the outer periphery of the respective supply line and on the other hand from the inner wall of the respective housing feed-through socket thanks to the two separate parts of the sealing sleeve and the sealing element. The material choice, dimensions, etc., can therefore be optimally adapted to the particular material, especially the cable jacket of the supply line on the one hand and on the other hand the metal of the housing feed-through sockets. Sealing sleeve and sealing element are therefore preferably also made of different materials.

In accordance with an additional feature of the invention, the sealing sleeve as a whole is fashioned somewhat pot-shaped with an annular sleeve bottom and a sleeve envelope. The sealing element lies in the space spanned by the sleeve envelope. Furthermore, an annular envelope preferably adjoins the annular sleeve bottom, bearing against and sealing the cable jacket along its circumference. The steplike configuration, looking in cross section, already therefore achieves a sealing by the sealing sleeve both from the supply line and from the housing feed-through socket. At the same time, a receiving space is created for the sealing element.

In regard to a reliable electrical contacting of the shielding with the inner housing, the shielding at first makes contact with a shielding sleeve subassembly, which in turn is electrically connected to the inner housing. Therefore, the shielding sleeve subassembly on the one hand ensures a safe and reliable electrical connection for the shielding of the respective supply line and on the other hand and at the same time a reliable electrical connection to the inner housing in order to assure the desired continuous shielding.

In accordance with a further feature of the invention, the shielding sleeve subassembly is arranged in a respective housing feed-through socket, especially by clamping. The shielding sleeve subassembly is fashioned in particular on the side of the sealing element facing the connection space. Thanks to the clamping between the housing shells of the inner housing, a reliable electrical connection is assured. In particular, the shielding sleeve subassembly is also somewhat deformed. Preferably, the shielding sleeve subassembly has contact springs for this purpose, which are pressed in spring-like manner against the inner housing.

In the region of the shielding sleeve subassembly the inner housing has a respective connecting piece through which the cable is led. Thanks to the design of the connecting piece, a partial radial clamping of the shielding sleeve subassembly is assured.

Advisedly, the shielding sleeve subassembly comprises an underlying sleeve as well as a clamping element, especially one fashioned as a crimp element, wherein the shielding is clamped between underlying sleeve and clamping element. The clamping element is therefore fashioned in turn as a sleeve. The underlying sleeve is preferably arranged between the jacket and an overturned partial region of the shielding. The shielding itself is then clamped directly between the underlying sleeve and the clamping element.

Alternatively to this, the possibility also exists of inserting the underlying sleeve at the end face into the supply line underneath the shielding for the contacting of the shield, and to clamp the clamping element on the jacket at the outside. The underlying sleeve generally affords an abutment for the clamping element.

Thanks to the clamping arrangement of the shielding sleeve subassembly in the respective housing feed-through socket, the subassembly experiences a (slight) deformation.

Furthermore, the shielding sleeve subassembly preferably comprises an encircling annular radial web, which encloses the sealing element in the direction of a sleeve bottom of the sealing sleeve. This radial web for example presses the sealing element against the annular sleeve bottom so that a reliable sealing through the sealing element is achieved.

Preferably, the radial web is part of the underlying sleeve, which is adjoined by a sleeve shaft, with which the underlying sleeve is inserted between the cable jacket of the supply line and the clamping element. In this way, an especially reliable and effective shield contacting is achieved.

In accordance with again a further feature of the invention, the shielding sleeve subassembly is held axially immovable and preferably form fitting in the respective housing feed-through socket. By axial direction is meant here the insert direction, i.e., the longitudinal direction of the housing feed-through socket. The form fitting fixation is accomplished here between the inner housing and at least one of the two sleeves, preferably the crimp sleeve. For this, the sleeve is radially broadened or flared preferably at least at one end for a form fit acting in one direction, preferably at both ends for a form fit acting in both directions. The flared edges project in the axial direction beyond an outer as well as an inner edge face of the housing feed-through socket in the shape of a connecting piece to form a form fit acting in both directions.

The term "form fit" connotes a form-locking connection, or positive connection, wherein two elements are connected together due to the shape of the elements themselves, as opposed to a force-locking connection, or friction lock, which locks the elements together by force external to the elements.

In an advisable modification, an insulating element is inserted in the connection space of the housing, being fashioned in particular as a separate, independent structural part. This is an injection molded part in particular. This insulating element encloses a connection site between the incoming and outgoing supply line.

The insulating element preferably consists of several parts, for example a base body and a closing part, so that when the insulating element is open the supply lines are inserted in an easy manner and then can be securely enclosed in the insulating element by putting the closing part in place. The two parts of the insulating element are joined together by snap connections, for example.

In accordance with a concomitant feature of the invention, the insulating element has such an overall configuration that it has a complementary shape to at least part of the inner housing. The shape is chosen such that the insulating element as a whole is inserted with a form fit in the inner housing and fixed by this form fit in at least one direction, preferably all directions.

In particular, the inner housing for this purpose has a bulge or an indentation in partial regions and in complementary fashion the insulating element has an indentation or bulge. Advisedly, the insulating element is held with form fitting by the two shell pieces of the inner housing both in the longitudinal direction of the line and perpendicular to it. In this way, on the whole, the insulating element is fixed stationary in a defined position. Thanks to the insulating element, the connection and contact sites between the two supply lines are protected and in particular they are reliably separated and insulated against each other. An insulating separation from the likewise conductive inner housing is also reliably achieved in this way.

Other features which are considered as characteristic for the invention are set forth in the appended claims.

Although the invention is illustrated and described herein as embodied in an electrical power distributor for an electric or hybrid vehicle and a distributor housing for such a power distributor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
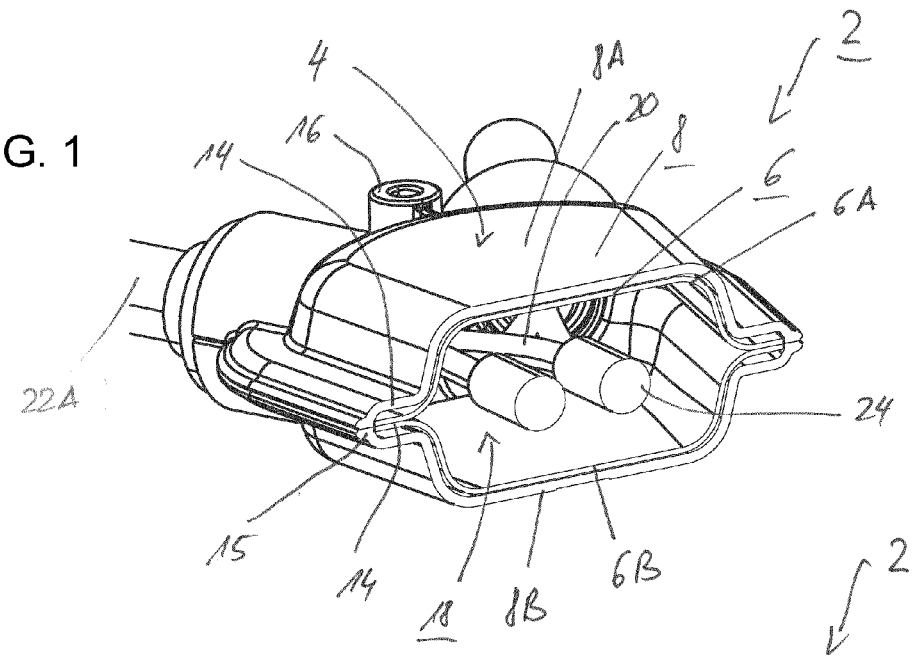
FIG. 1 is a perspective view of a high voltage power distributor in cross sectional view.
Figure 2:
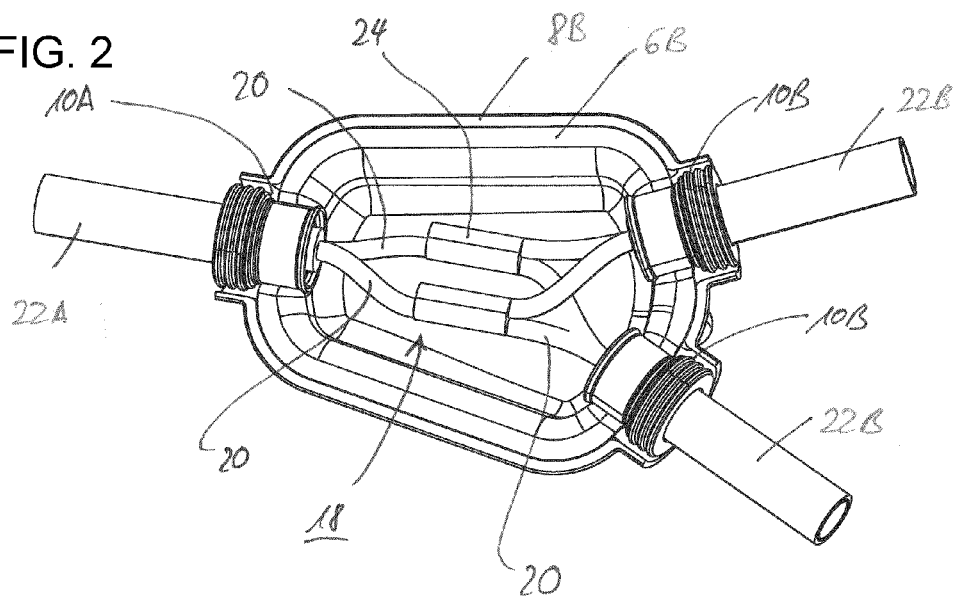
FIG. 2 is a front view of the power distributor as per FIG. 1, in which the upper housing shells have been removed.
Figure 3:
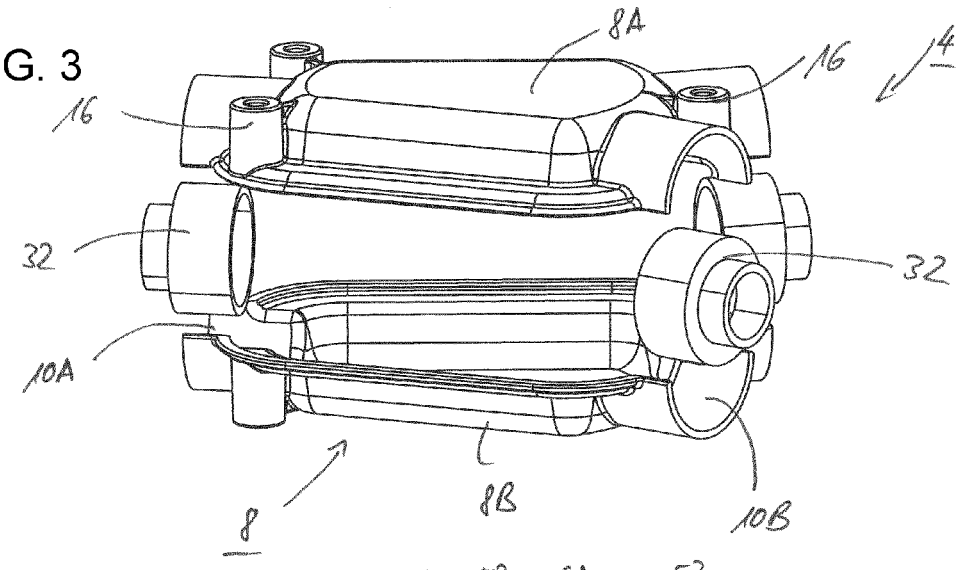
FIG. 3 is a perspective exploded representation of an outer housing of the distributor housing of the power distributor.

Referring now to the figures of the drawing in detail and first, particularly, to FIGS. 1 and 2 thereof, there is shown a high voltage power distributor 2 with a distributor housing 4, which has an inner housing 6 and an outer housing 8 enclosing the inner housing in the manner of a shell. The two housings 6, 8 are themselves in turn formed by two half shells respectively, namely, an upper shell 6A, 8A and a lower shell 6B, 8B. The two half shells 6A, 6B of the inner housing 6 are bent sheet metal parts and together form a completely enclosed metal inner housing 6, which is only open at housing feed-through sockets 10A, 10B. The inner housing 6 is entirely enclosed by the outer housing 8, with the outer housing 8 following the contours of the inner housing 6, and therefore fitting substantially snugly against the inner housing 6. The outer housing 8 is made from a nonconductive material, especially plastic. The half shells 8A, 8B are made in particular as injection molded parts. Due to the insulating property of the outer housing, an electrical insulation of the inner housing 6 against the outside environment is also assured, so that corresponding safety requirements in regard to protection against electrocution, for example, are also observed.

The power distributor 2 as a whole is fashioned in the manner of a Y distributor in the exemplary embodiment. Basically other distributor shapes are also possible, such as a T shape or a comb shape. The power distributor 2 has an incoming housing feed-through socket 10A at its one end face and two outgoing housing feed-through sockets 10B at the opposite end face. At least the outer housing 8 forms feed-through connecting pieces in the area of the housing feed-through sockets 10A, 10B.

The half shells 6A, 6B and 8A, 8B each have an encircling edge 14, extending in a horizontal and separation plane. The upper shell 6A lies with its edge 14 on the full surface of the corresponding edge 14 of the lower shell 6B of the inner housing 6. The edges 14 of the outer housing 8 as it were pinch this edge region of the inner housing 6 between them. The housing shells 6A, 6B, 8A, 8B are fastened together by suitable fastening means. In the sample embodiment, this is done by screw fastening. For this, the outer housing 8 has screw bosses 16 in which fastening screws are inserted in the mounted state.

As is seen especially in FIG. 1, the edge 14 has a sealing edge 15 at its periphery, which projects beyond the edge 14 of the inner housing 6, so that the inner housing 6 is fully enclosed all around. The two half shells 8A, 8B of the outer housing 8 lie in a sealing manner with their sealing edge 15 against each other. If necessary, an additional sealing element can also be introduced between the sealing edges 15.

The inner housing 6 defines within the curved half shells 6A, 6B a connection space 18, into which line conductors 20 of supply lines 22A, 22B are introduced and electrically joined together by a connection element 24. In the sample embodiment, an incoming supply line 22A is connected to two outgoing supply lines 22B. In the example, in each case a two-conductor supply line 22A, 22B is represented with two line conductors 20. Each line conductor 20 of the incoming supply line 22A is connected respectively to one line conductor 20 of a respective outgoing supply line 22B. The connection element 24 is configured, for example, as a crimp element or also a welded contact element.

Figure 4:
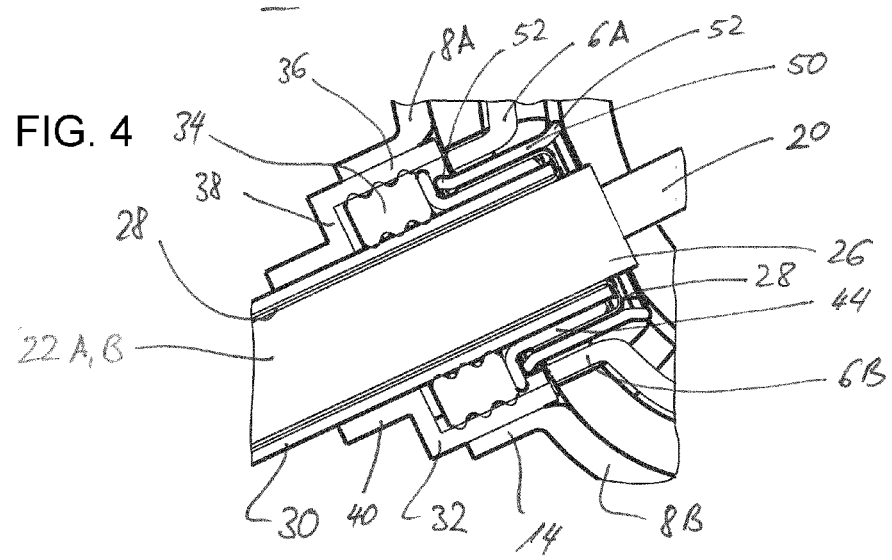
FIG. 4 is an enlarged feature of a sectional representation in the area of a housing feed-through socket with supply line inserted therein.
Figure 5:
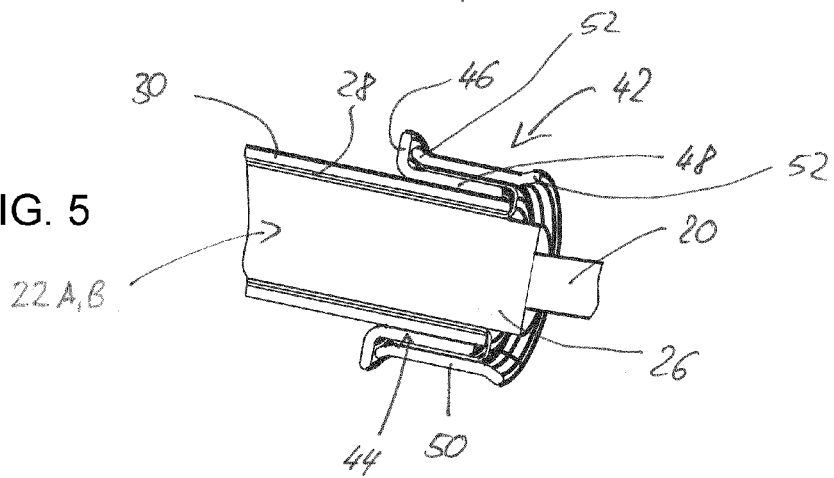
FIG. 5 is a feature of a sectional view of a supply line with a shielding sleeve subassembly arranged at the end thereof.

As illustrated in FIGS. 4 and 5, the supply lines 22A, 22B each have, besides the line conductor 20, an inner insulation 26 enclosing it, a shielding 28 in turn surrounding the latter, and finally a cable jacket 30 on the outside. The shielding 28 is formed in particular as a metal shielding braid.

For a sealed insertion of the supply lines 22A, 22B into the connection space 18, a two-part sealing arrangement is inserted in a respective housing feed-through socket 10A, 10B. Namely, in the sample embodiment, this consists of a sealing sleeve 32, which accommodates a sealing element 34, such as is seen in particular by means of FIG. 4.

The sealing sleeve 32 here defines a pot-shaped seat, in which the sealing element 34 is installed. It has a hollow cylindrical shaft 36 extending in the cable lengthwise direction, which adjoins an annular sleeve bottom 38 at its side facing away from the connection space 18. In turn, this is adjoined by a sleeve-like annular web 40. On the whole, therefore, the sealing sleeve 32 looking in cross section is step-like, with the hollow shaft 36 and the annular web 40 extending in the cable lengthwise direction and the sleeve bottom 38 in a transverse direction perpendicular to that. The annular web 40 lies against and seals the cable jacket 30. At the same time, the hollow shaft 36 lies with its outside against the inside of the respective housing feed-through socket 10A, 10B on the outer housing 8.

The sealing element 34, in turn, is clamped between the inside of the sleeve shaft 36 and the cable jacket 30, so that a reliable sealing is achieved. As can be seen from FIG. 4, the sealing element 34 overall is fashioned as an O-ring, which is fashioned with individual wavelike elevations and depressions on both its inside and its outside, so that individual sealing webs are formed. The sealing element 34 consists of a suitable sealing material, such as silicone. The material of the sealing sleeve 32 is preferably different from this and in particular it is adapted to a reliable sealing with the outer housing 8.

Alternatively to the described sealing arrangement, the sealing element is arranged directly between the cable jacket 30 and the inner wall of the respective housing feed-through socket 10A, 10B, i.e., between the cable jacket 30 and the distributor housing 4, especially the outer housing 8.

Especially in this configuration a closure cap of insulating material is pulled over the respective housing feed-through socket 10A, 10B forming an insert connecting piece, being secured on the distributor housing 4 for example by a latching and furthermore being fixed to the cable jacket 30, preferably on the rear side, especially to ensure a tension relief. For the fixation, the closure cap has, for example on its rear side, a holding and fixation web, which extends in the axial direction and encloses the cable jacket 30 only partly. A fixation element, such as a cable clip, is passed around this holding web.

The metallic inner housing 6 serves overall for EMC shielding of the connection region in the connection space 18. In order to achieve a continual shielding, a secure electrical contacting of the inner housing 6 with the respective shielding 28 of the supply lines 22A, 22B is required. In order to ensure this, a shielding sleeve subassembly 42 is secured to a respective supply line 22A, 22B. This is especially noticeable in FIG. 5 or FIG. 4.

The shielding sleeve subassembly 42 comprises an underlying sleeve 44, which has a radial web 46 extending in the transverse direction as well as a sleeve shaft 48 extending in the cable lengthwise direction. The underlying sleeve 44 lies with the sleeve shaft 48 against the cable jacket 30. The radial web 46 sticks out in the radial direction and in the installed state it encloses a receiving space toward the sleeve bottom 38, in which the sealing element 34 is inserted.

Furthermore, the shielding sleeve subassembly 42 comprises a crimp sleeve 50, which is crimped from the outside under the intermediate layer of the shielding 28 with the sleeve shaft 48, i.e., it is clamped on the latter. This accomplishes a secure and reliable contacting between the shielding 28 and the crimp sleeve 50. The crimp sleeve 50, finally, is joined electrically conductively to the inner housing 6. For this, the crimp sleeve 50 has, for example, respective curved spring tongues at its end faces, with which the crimp sleeve 50 is pressed against the edge 40 of the respective half shell 6A, 6B of the inner housing 6. On the whole, when the two shells 8A, 8B of the outer housing 8 are braced against each other during the installation, the two half shells 6A, 6B of the inner housing 6 are braced against the crimp sleeve 50 in order to assure a reliable electrical contacting.

Referring again to FIGS. 4 and 5, the crimp sleeve has a flared encircling edge 52 at both ends. The half shells 6A, 6B form, as the housing feed-through socket 10A, 10B, an insert connecting piece, extending in the inserting or axial direction. This is bordered on the outside by an outer edge face and on the inside by an inner housing enlargement. The crimp sleeve 50 is clamped in its middle region between the two edges 52 of this insert connecting piece, i.e., by the two half shells 6A, 6B. The edges 52 each grasp the insert connecting piece in form fit at its two ends and lie directly against it. In this way, the shielding sleeve subassembly 42 is held immovably in the respective housing feed-through socket 10A, 10B.

Furthermore, the shielding sleeve subassembly 42 thanks to its design also serves for tension relief of the respective supply line 22A, 22B. An effective tension relief is achieved here in particular by the axial fixation of the shielding sleeve subassembly 42 on the inner housing 6 on the one hand and its force fitting and preferably also form fitting connection to the cable jacket 30. As a result of the crimping, the cable jacket 30 is preferably deformed, so that a form fit with the cable jacket 30 acting in the axial direction is formed.

During installation, one proceeds as follows: the respective supply lines 22A, 22B being joined together are stripped of their insulation at the ends. This exposes the respective line conductor 20. The cable jacket 30 is removed in a partial region without cutting through the shielding 28. Next, the underlying sleeve 44 is pushed over the cable jacket 30 before the shielding 28 is turned over by around 180°, so that it comes to bear against the circumference side of the sleeve shaft 48. Next, the crimp sleeve 50 is pulled across the sleeve shaft 48 and then clamped to it with a crimping process.

Figure 6:
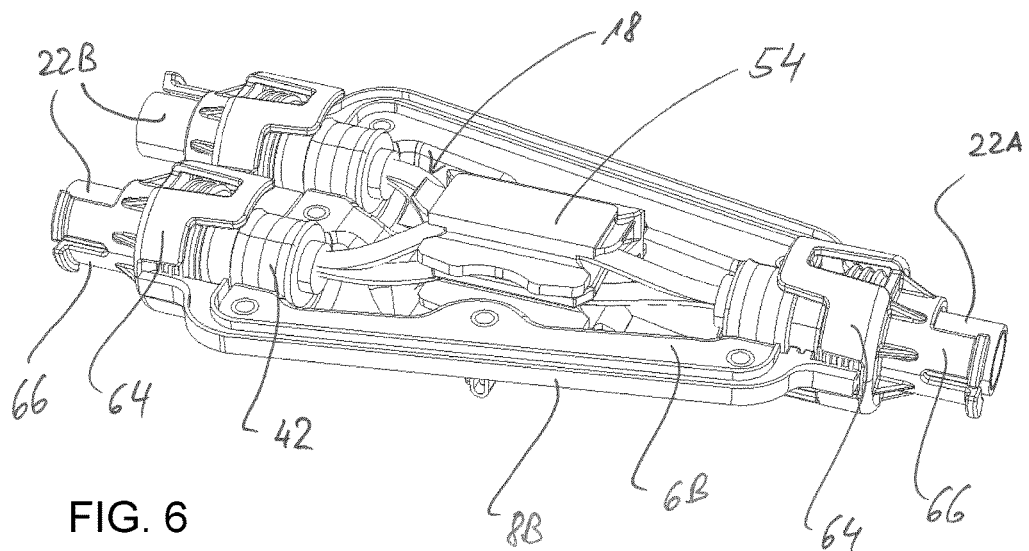
FIG. 6 is a perspective view of a power distributor as per a second variant with opened housing.
Figure 7:
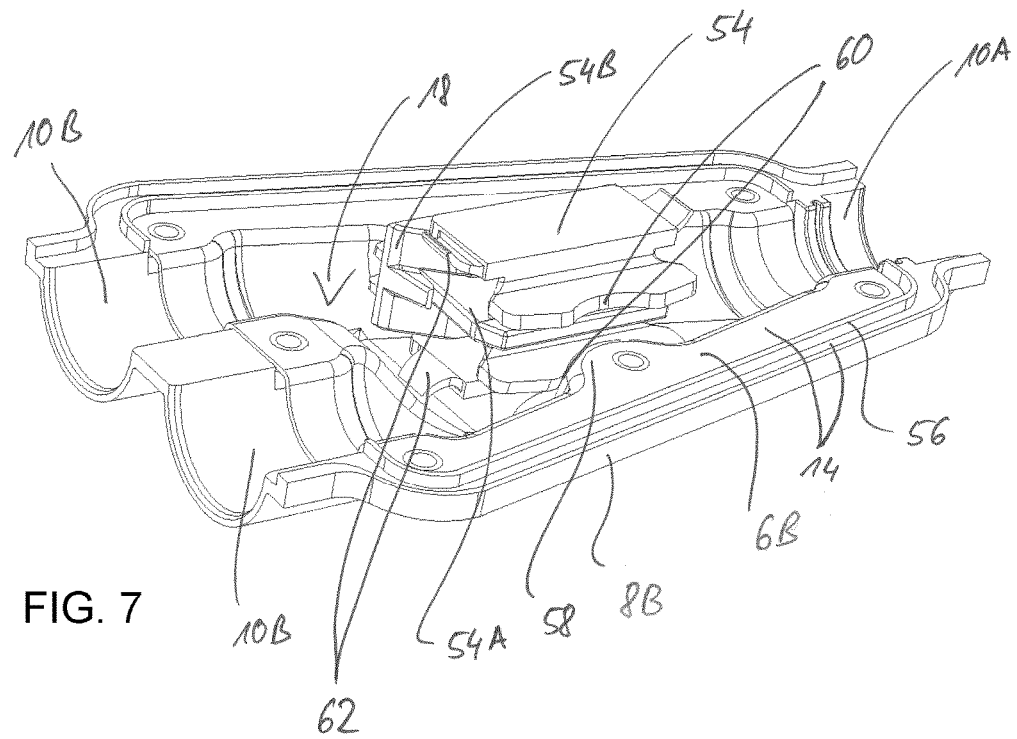
FIG. 7 is a part of the housing with an installed insulating element of the power distributor as claimed in FIG. 6.
Figure 8:
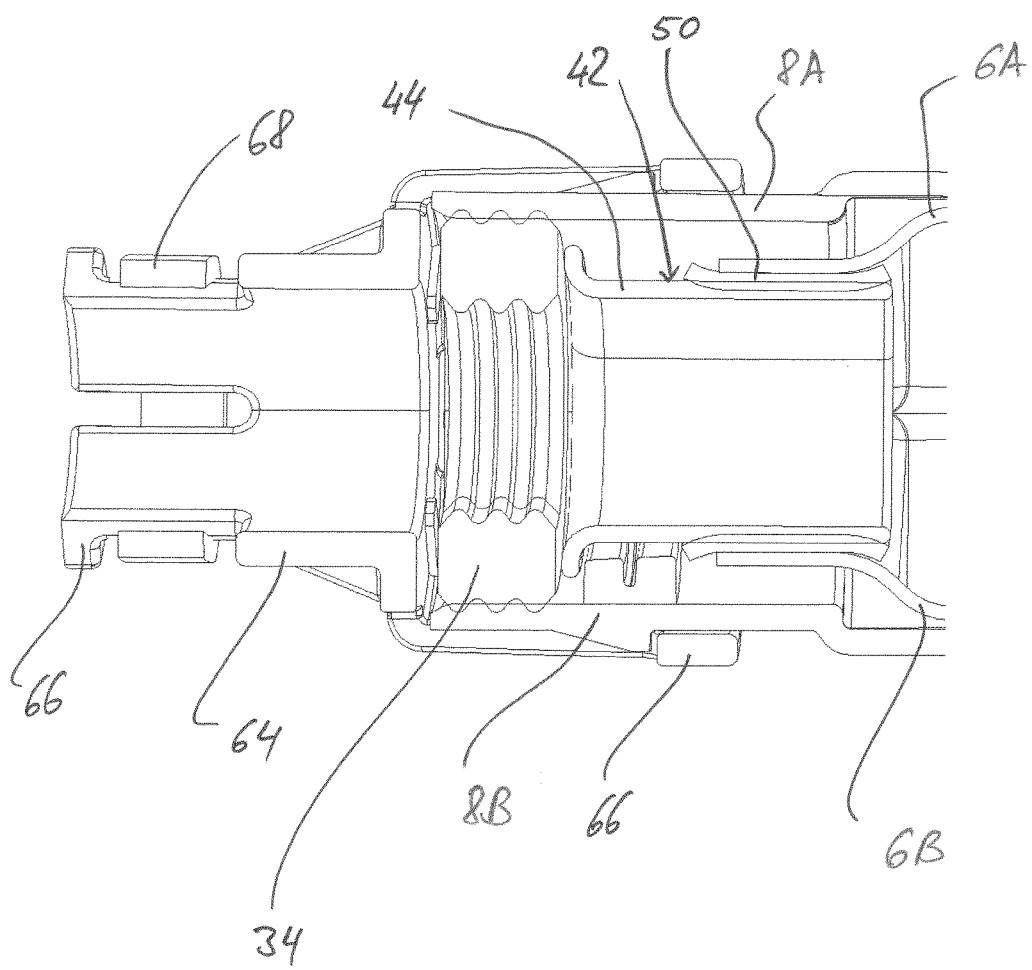
FIG. 8 is a feature of a sectional representation in the region of a housing feed-through socket as claimed in a second variant.

FIGS. 6 to 8 show a second exemplary embodiment of the power distributor 2. As is especially evident in FIGS. 6 and 7, this second embodiment is characterized in particular by the arrangement of an additional insulating element 54. Inside this insulating element 54 the electrically conductive connection occurs between the incoming supply lines 22A and the outgoing supply lines 22B. Another distinguishing feature involves the configuration in the region of the housing feed-through sockets 10A, 10B.

The configuration of the distributor housing 4 with the inner housing 6 and the outer housing 8 is basically unchanged from the first variant embodiment and accordingly reference is made to that. The inner housing 6 therefore consists once more of two sheet metal shells 6A, 6B, which are formed for example as deep-drawn parts and which enclose between themselves a completely closed connection space 18, which defines a free internal cavity.

It can be recognized once more from the representation of FIG. 7 that the shells 6A, 6B; 8A, 8B of the two housings 6, 8 are nested in each other like shells. The shells 8A, 8B of the outer housing therefore have the same contour as the shells 6A, 6B of the inner housing, and are thus directly applied against these shells 6A, 6B. In the variant embodiment of FIGS. 6 and 7, the encircling edge 14 furthermore has a limiting web 56, against which the outer contour of the likewise encircling edge 14 of the inner housing 6 bears with form fitting, so that it is fixed in place.

It is furthermore easily seen from the representation of FIG. 7 that the housing feed-through sockets 10A, 10B are fashioned in the manner of connecting pieces. Each of the shell parts 6A, 6B; 8A, 8B has a respective half piece. The connecting pieces of the outer housing 8 stick out beyond those of the inner housing 6 in the direction of the supply lines 22A, 22B. As is especially seen also in FIG. 6 and also from the cross sectional representation of FIG. 8, the sealing element 34, fashioned as an O-ring, is installed in the protruding connecting piece region of the outer housing 8. At the same time, the shielding sleeve subassembly 42 is arranged at least partly also in the region of the connecting piece of the inner housing 6 and clamped inside this connecting piece. As is especially noticeable in FIG. 8, the inner housing 6, that is to say the respective shell 6A, 6B, is radially retracted and curved somewhat inward in order to form the connecting piece. In this connecting piece region, a radial pressing and clamping force is exerted on the shielding sleeve subassembly 42, so that this is reliably clamped inside this connecting piece. The radial clamping produces here an especially good electrical and permanently reliable contacting between the shielding 28 (not shown here in FIG. 8), the shielding sleeve subassembly 42, and the inner housing 26.

In FIG. 8, for reasons of clarity, the supply line 22A, 22B has not been drawn.

The insulating element 54 in the sample embodiment consists of two elements, namely, a basic body 54A and a cover piece 54B, which are interlocked together. The basic body 54A thus forms chambers which define two separate receiving spaces for the supply lines 22A, 22B being connected. The supply lines 22A, 22B can therefore be inserted in easy fashion in these chambers. After being inserted, the cover piece 54B closes the chambers, so that the contact sites with the connection element 24, for example, are arranged insulated and separated from each other inside these chambers.

In the sample embodiment, the chambers are arranged one above the other perpendicular to the direction of extension of the supply lines 22A, 22B. The insulating element 54 is fixed in place inside the inner housing 6. For this, the insulating element 54 is preferably joined by form fitting with the inner housing 6. Advisedly, a form fit with the shells 6A, 6B is formed both in the direction of extension of the supply line 22A, 22B and perpendicular to that.

To form the form fit in the extension direction in the sample embodiment, the inner housing 6, that is, each of the two shells 6A, 6B has a bulge 58*a* at the edge, which engages with a corresponding indentation 60 of the insulating element 54. For this, the insulating element 54 has projecting areas at the edge. The insulating element 54 is advisedly joined by form fitting on each side with each of the two housing shells 6A, 6B and in particular has such an indentation 60 for each shell 6A, 6B on one edge side. The form fitting connection occurs on both opposing sides of the insulating element 54.

For the fixation of the insulating element 54 perpendicular to the longitudinal extension, the insulating element has tabs 62 curved each time upward or downward with respect to the shells 6A, 6B. These either engage with correspondingly formed recesses or are braced elastically against the shells 6A, 6B.

As is especially noticeable in FIGS. 6 and 8, in each case a cap element 64 is fashioned in the region of the housing feed-through sockets 10A, 10B, through which the respective supply line 22A, 22B is passed. The cap element is a plastic element, which on the one hand encloses the respective supply line 22A, 22B as a sleeve and on the other hand the respective connecting pieces of the outer housing 8. Thanks to the cap element 64 there is also a tension relief, for example. For this, the cap element 64 is fixed on the one hand with the respective supply line 22A, 22B and on the other hand with the outer housing 8. The fixation to the outer housing 8 is done preferably by a snap connection with the help of latching elements.

For the fixation of the supply line 22A, 22B, the cap element 64 has a fastening piece 66, which is fashioned to be encircling for only a limited angle range. In the region of this fastening piece 66, a fixation element 68 is arranged in the final installed state, such as a cable clip (see FIG. 8), which in this place clamps the supply line 22A, 22B to the fastening piece 66.

On the whole, the power distributor 2 described here accomplishes a power distribution from an incoming supply line 22A to several outgoing supply lines 22B, achieving a reliable electrical EMC shielding as well as a sealing against the outside environment. The power distributor 2 is distinguished by a simple and robust design with the distributor housing 4.

The power distributor 2 in the final installed state is arranged in a vehicle, which is outfitted in particular with an electric motor drive system as an electric or hybrid vehicle.

The following is a summary list of reference numerals and the corresponding structure used in the above description of the invention:

2 power distributor
4 distributor housing
6 inner housing
8 outer housing
6A, 8A upper shell
6B, 8B lower shell
10A incoming housing feed-through socket
10B outgoing housing feed-through socket
14 edge
15 sealing edge
16 screw boss
18 connection space
20 line conductor
22A incoming supply line
22B outgoing supply line
24 connection element
26 inner insulation
28 shield
30 cable jacket
32 sealing sleeve
34 sealing element
36 hollow shaft
38 sleeve bottom
40 annular web
42 shielding sleeve subassembly
44 underlying sleeve
46 radial web
48 sleeve shaft
50 crimp sleeve
52 edge
54 insulating element
54A basic body
54B cover piece
56 limiting web
58 bulge
60 indentation
62 tab
64 cap element
66 fastening piece
68 fixation element

The invention claimed is:

1. An electric power distributor for an electric or hybrid vehicle with an electric motor drive system, the power distributor comprising:
   a distributor housing having an inner housing made from two shells of an electrically conductive material enclosing a connection space and an outer housing of an electrically insulating material encasing said inner housing in a shell form;
   a plurality of supply lines including at least one incoming supply line and at least two outgoing supply lines connected in said connection space to said incoming supply line, said supply lines entering said connection space through a housing feed-through socket;
   said supply lines having a shielding connected electrically conductively with said inner housing;
   a shielding sleeve subassembly electrically connected to said inner housing and making electrical contact with said shielding, said shielding sleeve subassembly having an underlying sleeve and a clamping element fashioned as a sleeve, and wherein said shielding is clamped between said underlying sleeve and said clamping element;
   said inner housing having in each case a connecting piece to form the respective said housing feed-through socket in which said shielding sleeve subassembly is clamped, and wherein said shielding sleeve subassembly is fixed in an axial direction in the respective said housing feed-through socket, with at least one of said underlying sleeve and said clamping element being radially widened at both ends to form a form fit with said inner housing acting in both axial directions.

2. The power distributor according to claim 1, wherein said inner housing is a sheet metal housing.

3. The power distributor according to claim 1, wherein, except for said housing feed-through sockets, said inner housing is completely closed.

4. The power distributor according to claim 1, wherein said outer housing is formed by overmolding said inner housing.

5. The power distributor according to claim 1, wherein said outer housing comprises two separate half shells.

6. The power distributor according to claim 1, wherein said outer housing and said inner housing each consist of two half shells having an encircling edge, and the encircling edge of said inner housing lies between said half shells of said outer housing.

7. The power distributor according to claim 1, which comprises a sealing element inserted in a sealing sleeve, wherein a respective supply line is led through the respective said housing feed-through socket by way of said sealing element.

8. The power distributor according to claim 7, wherein said sealing sleeve is a pot-shaped sleeve.

9. The power distributor according to claim 7, wherein said shielding sleeve subassembly is formed with a radial web enclosing said sealing element in a direction of a sleeve bottom of said sealing sleeve.

10. The power distributor according to claim 9, wherein said sealing element is pressed in between the sleeve bottom and said radial web.

11. The power distributor according to claim 10, wherein said underlying sleeve comprises a radial web and a sleeve shaft, and said sleeve shaft is inserted between a jacket of said supply line and said clamping element.

12. The power distributor according to claim 10, wherein said clamping element has a broadened edge at both ends thereof, and the respective said housing feed-through socket in the shape of a connecting piece lies between said broadened edges.

13. The power distributor according to claim 1, wherein said shielding sleeve subassembly is clamped in the respective said housing feed-through socket.

14. The power distributor according to claim 1, wherein said sleeve of said clamping element is a crimp sleeve.

15. The power distributor according to claim 1, which comprises an insulating element inserted in said connection space, in which said at least one incoming supply line is connected to said at least two outgoing supply lines.

16. The power distributor according to claim 15, wherein said insulating element is a multiple-piece element.

17. The power distributor according to claim 15, wherein said insulating element is a separate molded element with a complementary shape to at least a part of said inner housing, so that said insulating element is fixed with a form fit in said inner housing.

* * * * *